| United States Patent [19] | [11] Patent Number: 4,868,091 |
|---|---|
| Boettcher et al. | [45] Date of Patent: Sep. 19, 1989 |

[54] PHOTOPOLYMERIZABLE RECORDING MATERIAL, IN PARTICULAR FOR THE PRODUCTION OF PRINTING PLATES AND RELIEF PLATES

[75] Inventors: Andreas Boettcher, Leimen; Bernd Bronstert; Gerhard Hoffmann, both of Otterstadt, all of Fed. Rep. of Germany

[73] Assignee: BASF Aktiengesellschaft, Ludwigshafen, Fed. Rep. of Germany

[21] Appl. No.: 103,366

[22] Filed: Oct. 1, 1987

[30] Foreign Application Priority Data

Oct. 1, 1986 [DE] Fed. Rep. of Germany ....... 3633436

[51] Int. Cl.$^4$ .......................... G03C 1/68; G03C 5/16; C08L 63/10; C08F 2/50
[52] U.S. Cl. ..................................... 430/281; 430/286; 430/923; 522/64; 522/28
[58] Field of Search .................... 522/64, 28; 430/281, 430/286, 923; 523/116

[56] References Cited

U.S. PATENT DOCUMENTS

| 3,695,877 | 10/1972 | Taneda et al. | |
|---|---|---|---|
| 4,292,152 | 9/1981 | Lechtken et al. | 525/59 |
| 4,737,593 | 4/1988 | Ellrich et al. | 568/15 |
| 4,762,892 | 8/1988 | Koch | 525/279 |

FOREIGN PATENT DOCUMENTS

| 0059988 | 9/1979 | European Pat. Off. |
|---|---|---|
| 2909992 | 3/1979 | Fed. Rep. of Germany |
| 3543646 | 3/1979 | Fed. Rep. of Germany |
| 2040390 | 8/1980 | Fed. Rep. of Germany |
| 3602472 | 5/1986 | Fed. Rep. of Germany |
| 3443221 | 6/1986 | Fed. Rep. of Germany |
| 3540950 | 7/1987 | Fed. Rep. of Germany |

Primary Examiner—Paul R. Michl
Assistant Examiner—Thorl Chea
Attorney, Agent, or Firm—Keil & Weinkauf

[57] ABSTRACT

Novel photopolymerizable recording materials, in particular for the production of printing plates and relief plates, can be developed with water or an aqueous alkaline solution and predominantly consist of a photoinitiator-containing mixture of (a) one or more low molecular weight compounds having one or more photopolymerizable olefinically unsaturated double bonds and (b) one or more organic polymeric binders and contain a bisacylphosphine oxide as the photoinitiator.

These recording materials are useful for the production of printing plates and relief plates.

14 Claims, No Drawings

PHOTOPOLYMERIZABLE RECORDING MATERIAL, IN PARTICULAR FOR THE PRODUCTION OF PRINTING PLATES AND RELIEF PLATES

The present invention relates to improved photopolymerizable recording materials which can be developed with water or an aqueous alkaline solution and predominantly consist of a photo initiator-containing mixture of (a) one or more low molecular weight compounds having one or more photopolymerizable olefinically unsaturated double bonds and (b) one or more organic polymeric binders which contain a bisacylphosphine oxide compound as a photoinitiator.

Photopolymerizable recording materials, as used for the production of printing plates and relief plates, have been described in many publications and include both liquid and solid materials. For example, recording materials of this type are described in German Laid-Open Application DOS No. 2,040,390 or French Pat. No. 1,520,856. Aromatic ketones, such as benzil ketals, benzoin ethers or α-methylol derivatives of benzoin ethers are mainly used as photoinitiators for the recording materials. Although these initiator systems give useful results, the modern recording methods, particularly in newspaper printing, require increasingly short exposure times, a condition which cannot be satisfactorily met using the conventional photoinitiator systems. Thus, the environmentally compatible water-developable printing plates to date react so sluggishly that it is necessary to resort to pre-exposure in order to ensure adequate sensitization. In addition to other disadvantages, however, this means an additional operation.

In the case of the recording materials containing the conventional initiator systems, the relief structure, too, frequently has a disadvantageous form and has to be improved by special measures, such as the addition of photochromic compounds, controlling light reflection at the base or the addition of particular inhibitors, which, however, prolong the exposure time.

An important improvement was achieved by the use of acylphosphine oxide compounds as photoinitiators (European Pat. No. 59,988).

It is an object of the present invention to provide recording materials which are easier to handle, permit an even shorter total exposure time even without pre-exposure and, where pre-exposure proves advantageous, allows the degree of preexposure to be set more exactly.

We have found, surprisingly, that this object is achieved by the use of certain bisacylphosphine oxides.

The present invention thus relates to photopolymerizable recording materials which can be developed with water or an aqueous alkaline solution. They are particularly suitable for the production of printing plates and relief plates, consist of a photoinitiator-containing mixture of (a) one or more low molecular weight compounds having one or more photopolymerizable olefinically unsaturated double bonds and (b) one or more organic polymeric binders, and contain, as a photoinitiator a bisacylphosphine oxide compound of the formula

where $R^1$ is alkyl of 1 to 6 carbon atoms, cycloalkyl where the ring is of 5 or 6 carbon atoms, aryl which is unsubstituted or substituted by halogen, alkyl or alkoxy, or an S-containing or N-containing five-membered or six-membered heteocyclic radical, and $R^2$ and $R^3$ are identical or different acyl radicals whose carbonyl group is bonded to a tertiary alkyl radical of 4 to 18 carbon atoms, a tertiary cycloalkyl radical where the ring is of 5 or 6 carbon atoms, aryl or a 5-membered or 6-membered heterocyclic radical, and the aryl or 5-membered or 6-membered heterocyclic radicals contain substituents A and B bonded at least in the two positions ortho to the carbonyl group, and A and B may be identical or different and are each alkyl, alkoxy, alkoxyalkyl, alkylthio, cycloalkyl, aryl or halogen.

The feature "contains substituents A and B bonded in the two positions ortho to the carbonyl group" is understood here as meaning that the substituents A and B are bonded to the two ring carbon atoms which may be substituted and which are adjacent to the bonding site of the carbonyl group. This means that the α-naphthyl radical contains the substituents A and B bonded at least in the 2,8-position and the β-naphthyl radical contains the said substituents bonded at least in the 1,3-position.

Regarding the formula (I), the following may be stated specifically: $R^1$ may be straight-chain or branched alkyl of 1 to 6 carbon atoms, such as methyl, ethyl, prop-1-yl, n-propyl, n-butyl, amyl or n-hexyl, cyclopentyl or cyclohexyl, aryl such as phenyl or naphthyl, halogen-substituted aryl, such as mono- or dichlorophenyl, alkyl-substituted aryl, such as methylphenyl, ethylphenyl, isopropylphenyl, tertbutylphenyl or dimethylphenyl, alkoxy-substituted aryl, such as methoxyphenyl, ethoxyphenyl or dimethoxyphenyl, an S-containing or N-containing five-membered or six-membered heterocyclic radical, such as thiophenyl or pyridyl, and $R^2$ and $R^3$ may be identical or different acyl radicals, but are preferably identical acyl radicals.

For example, a phenyl or naphthyl radical, or a five-membered or six-membered heterocyclic radical containing, in particular, S, N or O ring atoms in the heterocyclic structure, eg. furyl, pyrrolyl, thienyl, pyranyl or pyridyl, which contains the substituents A and B bonded at least in the two positions ortho to the carbonyl group, can be bonded to the carbonyl group of the acyl radicals $R^2$ and $R^3$ Suitable substituents A and B are straight chain or branched alkyl, of, in particular, 1 to 6, preferably 1 to 4, carbon atoms, such as methyl, ethyl, propyl, isopropyl, butyl, isobutyl and tert-butyl, unsubstituted or substituted cycloalkyl, such as cyclohexyl, unsubstitued or substituted aryl, eg. phenyl or toluyl, alkoxy or alkylthio of, in particular, 1 to 6, preferably 1 to 4, carbon atoms, such as methoxy, ethoxy, propoxy, isopropoxy, n-butoxy, methylthio, ethylthio, propylthio, isopropylthio, n-butylthio, sec-butylthio or tert-butylthio, alkoxyalkyl of, in particular, 2 to 12, preferably 2 to 8, carbon atoms, such as 2-methoxyethyl or tert-butoxyprop-2-yl, and halogen, in particular chlorine or bromine.

Preferred substituents A and B are halogen, in particular chlorine, alkoxy, eg. methoxy, and alkyl, eg. methyl and ethyl.

$R^2$ and $R^3$ can, however, also be tertiary alkyl or cycloalkyl radicals (each having a tertiary carbon atom in the position adjacent to the carbonyl group), such as tert-butyl, 1,1-dimethylheptyl, 1-methylcyclohexyl or 1-methylcyclopentyl.

Bisacylphosphine oxides, their preparation and their use in photopolymerizable dental compositions are disclosed in EP-A-01 84 095. In comparison, the effects obtained when bisacylphosphine oxides are used in photopolymerizable recording materials which can be developed with water or an aqueous alkaline solution, in particular the improved handling properties achieved, are doubtless surprising.

Bisacylphosphine oxide compounds can be prepared, for example, using methods similar to those described in DE-A-34 43 221.

Very suitable recording materials are those which contain bisacylphosphine oxide compounds of the formula I, where $R^1$ is aryl of 6 to 12 carbon atoms, such as naphthyl, toluyl or, in particular, phenyl, $C_1$-$C_4$-alkoxy such as methoxy or ethoxy, or in particular, aryl of 6 to 12 carbon atoms.

Examples of suitable bisacylphosphine oxides of the formula I for the novel recording materials are: bis-(2,6-dichlorobenzoyl)-phenylphosphine oxide, bis-(2,6-dichlorobenzoyl)-2,5-dimethylphenylphosphine oxide, bis-(2,6-dichlorobenzoyl)-4-ethoxyphenylphosphine oxide, bis-(2,6-dichlorobenzoyl)-4-chlorophenylphosphine oxide, bis-(2,6-dichlorobenzoyl)-4-propylphenylphosphine oxide, bis-(2,6-dichlorobenzoyl)-4-biphenylylphosphine oxide, bis-(2,6-dimethoxybenzoyl)-2,5-dimethylphenylphosphine oxide, bis-(2,6-dimethoxybenzoyl)-phenylphosphine oxide, bis-(2,6-dichloro-3,4,5-trimethoxybenzoyl)-2,5-dimethylphenylphosphine oxide, bis-(2-methyl-1-naphthoyl)-phenylphosphine oxide, bis-(2-methyl-1-naphthoyl)-4-bisphenylylphosphine oxide, bis-(2-methoxy-1-naphthoyl)-2,5-dimethylphenylphosphine oxide and bis-(2-methoxy-1-naphthoyl)-4-ethoxyphenylphosphine The novel recording materials can contain the bisacylphosphine oxides of the formula I as sole photoinitiators, in general in an amount of from 0.005 to 10, in particular from 0.05 to 5% by weight, based on the total amount of the photopolymerizable recording material; however, the bisacylphosphine oxide compounds can also be used in combination with known photoinitiators in the photopolymerizable recording materials. Examples of suitable known photoinitiators are those of the ketone type, such as benzil dimethyl ketal, α-hydroxyisobutyrophenone or diethoxyacetophenone, and α-methylolbenzoin ethyl ether, benzoin mthyl ether and benzoin isopropyl ether.

It is often advantageous if, in the recording materials, the bisacylphosphine oxides of the formula I are used in combination with tertiary amines, such as methyldiethanolamine, dimethylethanolamine, triethanolamine, ethyl p-dimethylaminobenzoate or p,p'-dialkylamino-substituted benzophenones, eg. Michler's ketone. The total concentration of the initiator system (photoinitiators plus amines) is from 0.05 to 15% by weight, based on the total amount of the photopolymerizable recording material, the amount of amines preferably being not less than half the total initiator content.

For the mixture of (a) and (b), which forms the basis of the novel recording materials, suitable low molecular weight compounds having one or more photopolymerizoxide. able olefinically unsaturated double bonds are the monomers conventionally used for such materials, provided that they form compatible mixtures with the particular polymeric binders chosen and have a boiling point higher than 100° C. under atmospheric pressure. In general, they have a molecular weight of less than 2000, in particular less than 1000. Preferred monomers are those which possess two or more olefinically unsaturated photopolymerizable double bonds, alone or as a mixture with monomers having only one olefinically unsaturated photopolymerizable double bond; in the latter case, the amount of monomers having only one double bond is in general only about 5-50, preferably 5-30, % by weight, based on the total amount of monomers. The type of monomers used depends substantially on the type of polymeric binder present. For example, suitable compounds are difunctional and polyfunctional acrylates and methacrylates, as can be prepared by esterification of diols or polyols with acrylic acid or methacrylic acid, such as the di- or tri(meth)acrylates of ethylene glycol, diethylene glycol, triethylene glycol, polyethylene glycol having a molecular weight up to about 500, propane-1,2-diol, propane-1,3-diol, neopentylglycol, (2,2-dimethylpropanediol), butane-1,4diol, 1,1,1-trimethylolpropane, glycerol or pentaerythritol, as well as the monoacrylates and monomethacrylates of such diols and polyols, for example ethylene glycol monoacrylate or di-, tri- or tetraethylene glycol monoacrylate, monomers which have two or more olefinically unsaturated bonds and contain urethane groups and/or amide groups, such as the low molecular weight compounds prepared from aliphatic diols of the above mentioned type, organic diisocyanates and hydroxyalkyl (meth)acrylates, as well as reaction products of mono-, di- or polyepoxide compounds with acrylic acid, methacrylic acid or hydroxyalkyl(meth)acrylamides, with alcohols or polyhydric alcohols of the above mentioned type. Other examples are acrylic acid, methacrylic acid and their derivatives, such as (meth)acrylor amide, N-hydroxymethyl(meth)acrylamide and (meth)acrylates of monoalcohols of 1 to 6 carbon atoms. Mixtures of the above mentioned low molecular weight compounds are also suitable.

Derivatives of acrylamides, for example the reaction products of 2 moles of N-hydroxymethyl(meth)acrylamide with 1 mole of an aliphatic diol, such as ethylene glycol, xylylenebisacrylamide or alkylenebisacrylamide, where alkylene is of 1 to 8 carbon atoms, can also be used. Water-soluble monomers, eg. hydroxyethyl (meth)acrylate or mono- or di(meth)acrylates of polyethylene glycols having a molecular weight of about 200-500, are particularly suitable for the production of recording materials which can be developed with water or an aqueous alkaline solution, for example for the production of printing plates containing polyvinyl alcohol, alkoxylation products of polyvinyl alcohol, polyvinylpyrrolidone or acrylate rubbers having carboxyl side groups as polymeric binders.

Suitable organic polymeric binders (b) for the mixtures for the photopolymerizable recording materials which can be developed with water or an aqueous alkaline solution, and in particular for the production of printing plates and relief plates, are the conventional polymers used for this purpose. These polymers should in general be compatible with the low molecular weight compounds (a) concomitantly used and, a fact which is self-evident for the skilled worker, should be soluble or dispersible in the developer used, in order to permit the unexposed and uncrosslinked parts of a layer of the photopolymerizable recording materials to be washed out after the said materials have been exposed imagewise. Suitable saturated or unsaturated binders are cellulose derivatives, in particular cellulose derivatives which can be washed out with an aqueous alkaline solution, vinyl alcohol polymers and polymers and copolymers of vinyl esters of aliphatic monocarboxylic acids of 1 to 4 carbon atoms, such as vinyl acetate, having different degrees of hydrolysis, polyurethanes, polyetherurethanes and polyesterurethanes. Among the linear or branched polyesters prepared by reacting unsaturated or saturated dibasic or polybasic carboxylic acids with dihydric or polyhydric polyalcohols, those polyesters having a fairly high acid number, in particular from 75 to 160, are preferred since, when used in the materials, they lead to good dispersibility or solubility in aqueous alkaline developers. Regarding the composition and preparation of carboxyl-containing unsaturated polyester resins, reference may be made to the existing literature, for example the book by H. V. Boening, "Unsaturated Polyesters, Structure and Properties", Amsterdam, 1964.

Acrylate rubbers having carboxyl side groups, for example ethylene/n-butyl acrylate/acrylic acid copolymers, and the binders described in detail in the German Laid-Open Applications DOS No.s 3,540,950 DOS 3,543,646 and DOS 3,602,472 are also particularly advantageous.

The novel recording materials predominantly consist of the photoinitiator-containing mixture of (a) and (b), ie. contain more than 50, preferably from 70 to 100, by weight of the said mixture. The content of polymeric binder (b) in this mixture is in general about 45-90, in particular 45-65, % by weight, based on the sum of the amounts of polymers (b) and photopolymerizable low molecular weight compounds (a).

It is often advantageous if known thermal polymerization inhibitors are also added to the photopolymerizable materials in conventional amounts, examples of these inhibitors being hydroquinone, p-methoxyphenol, m-dinitrobenzene, p-quinone, methylene blue, β-naphthol, N-nitrosamines, such as N-nitrosodiphenylamine, phenothiazine, phosphites, such as triphenyl phosphite, or the salts, in particular the alkali metal and aluminum salts, of N-nitrosocyclohexylhydroxylamine.

The materials may also contain other conventional additives, such as plasticizers, saturated low molecular weights compounds containing amide groups, waxes, etc.

Processing of the photopolymerizable recording materials, for example to give photopolymer printing plates which contain the recording materials as a relief forming layer, can be carried out in a conventional manner and depends on the type of the mixture (a)+(b) and on whether the material is liquid or solid. The recording materials are processed (for example to give relief plates) in a conventional manner by imagewise exposure to actinic light using light sources which have emission maxima in the region of the absorption of the photoinitiators, in general from 300 to 500 nm, or possess a sufficient amount of light of this wavelength range, such as actinic or superactinic fluorescent tubes, low pressure, medium pressure and high pressure mercury lamps, which may be doped, and xenon lamps For the production of relief plates or photoresists, the unexposed parts of the layer of the recording materials are washed out, after the imagewise exposure, in a conventional manner with pure water or an aqueous alkali, for example 1% strength aqueous sodium hydroxide solution, and the resulting plates, for example relief printing plates, are dried, and in some cases advantageously also uniformly postexposed.

The novel photopolymerizable recording materials exhibit high reactivity during exposure, permitting more rapid curing of exposed parts of the layer. It is surprising that the recording materials nevertheless have excellent stability during storage. The fact that the novel recording materials make it possible for the pre-exposure time to be set more exactly and even for the total exposure time to be substantially reduced is particularly advantageous.

In the Examples and Comparative Examples which follow, parts and percentages are by weight, unless stated otherwise. Parts by weight bear the same relation to parts by volume as that of the kilogram to the liter.

EXAMPLE 1.

A photopolymerizable mixture consisting of 73% of a copolymer of 57.8% of ethylene, 24% of n-butyl acrylate and 18.2% of acrylic acid (melt flow index (MFI): 250), 20% of di-(2-ethylhexyl) phthalate, 5.5% of butanediol diacrylate, 0.2% of tert-butylcresol and 1.3% of the photo initiator bis-(2,6-dichlorobenzoye)-phenylphosphine oxide as a 48% strength solution in a mixture of 50% of toluene and 50% of diethylene glycol dimethyl ether at 80° C. was prepared. This mixture was applied to a 0.24 mm thick steel sheet, coated with a mixture of adhesive-forming components, in a wet thickness such that, when the solvents were evaporated in the air and the layer was dried for 2 hours at 85° C., a dry layer having a thickness of 0.380 mm resulted.

This layer was exposed through a negative which contained all elements relevant to printing, in a conventional manner, using a commercial 5 kW medium pressure mercury vapor lamp, until all relief elements were correctly formed after the washout process (with about 1% strength aqueous sodium hydroxide solution). The minimum exposure time required for this purpose was 2.5 minutes. The microhardness (measured in International Rubber Hardness Degrees) was 83 I.R.H.D.

Similar results were obtained when bis-(2,6-dimethoxybenzoyl)-phenylphosphine oxide was used instead of bis-(2,6-dichlorobenzoyl)-phenylphosphine oxide.

COMPARATIVE EXAMPLE 1

The procedure described in Example 1 was followed, except that 2,4,6-trimethylbenzoyldiphenylphosphine oxide was used instead of bis-(2,6-dichlorobenzoyl)-phenylphosphine oxide. The minimum exposure time required was 3.75 minutes. Measurement of the microhardness gave a value of 74 I.R.H D.

EXAMPLE 2

500 parts of water were heated to 85°-90° C. 347 parts of a partially hydrolyzed polyvinyl acetate having a mean degree of hydrolysis of 81% and a mean molecular weight of about 25,000 and 149 parts of a polyvinyl alcohol which had been internally plasticized in the main chain with polyethylene oxide segments and had a mean degree of acetalization of 14% and a mean molecular weight of about 22,000 were then introduced in succession at this temperature, with uniform stirring (200 rpm). Stirring was continued for 5 hours, after which the mixture was cooled to 60° C. At this temperature, a mixture of 420 parts of β-hydroxyethyl methacrylate and 6 parts of bis-(2,6-dichlorobenzoyl)-phenylphosphine oxide was introduced. This mixture was homogenized, and was then used to produce a 0.5 mm thick dry layer on a steel substrate. Under conventional conditions, this photopolymerizable layer required a minimum exposure time of 18 seconds for reproduction of all relief elements relevant to printing. The hardness of the layer after exposure to a 5 kW mercury lamp, development with water and drying (15 minutes at 80° C.) was about 2050 p.mm$^{-2}$ (Brinell ball indentation hardness).

COMPARATIVE EXAMPLE 2

The procedure described in Example 2 was followed, except that 2,4,6-trimethylbenzoyldiphenylphosphine oxide was used instead of bis-(2,6-dichlorobenzoyl)-phenylphosphine oxide. The minimum exposure time required was 26 seconds. The hardness of the layer after exposure, development and drying was about 1650 p.mm$^{-2}$.

EXAMPLE 3

294 parts of a partially hydrolyzed polyvinyl acetate (degree of hydrolysis 82 mol %, mean degree of polymerization 500) were dissolved in 294 parts of water at 90° C. by stirring for several hours The solution was cooled to 70° C., after which 200 parts of a monomer mixture consisting of 180 parts of 2-hydroxyethyl methacrylate and 20 parts of 1,1,1-trimethylolpropane triacrylate, and 10 parts of bis-(2,6-dichlorobenzoyl)-phenylphosphine oxide and 2 parts of 2,6-di-tert-butyl-p-cresol were added to the stirred solution. The homogeneous, viscous solution was filtered and degassed under reduced pressure. By application to a steel sheet provided with a mixture of adhesive-forming components, and drying for 24 hours at room temperature, a 550 μm thick non-tacky layer of the recording material was obtained. After preexposure for 3 seconds followed by exposure for 30 seconds through a negative in a printing plate exposure unit provided with an Fe-doped medium pressure Hg lamp (5 kW), washout with water in a spray washer and subsequent drying at 100° C., a plate having a good relief structure and excellent mechanical properties was obtained, from which several thousand prints were produced without any loss of quality. In the print test, the relief printing plates gave well defined readable negative script which completely met newspaper requirements.

COMPARATIVE EXAMPLE 3

A printing plate was produced as described in Example 3, but using a recording material which contained 2,4,6-trimethylbenzoyldiphenylphosphine oxide in the same amount, as the photoinitiator. Comparison of the required exposure time for the recording materials for the same amounts of the particular photoinitiators gave the following properties:

| Recording material containing | Preexposure | Imagewise exposure |
|---|---|---|
| 2,4,6-Trimethylbenzoyldiphenylphosphine oxide (= Comparative Example 3) | 2 sec. | 40 sec. |
| Bis-(2,6-dichlorobenzoyl)-phenylphosphine oxide (= Example 3) | 3 sec. | 30 sec. |

We claim:

1. A photopolymerizable recording material which can be developed with water or an aqueous alkaline solution, in particular for the production of printing plates and relief plates, predominantly consisting of a photoinitiator-containing mixture of (a) one or more low molecular weight compounds having one or more photopolymerizable olefinically unsaturated double bonds and (b) one or more organic polymeric binders, wherein the said recording material contains, as a photoinitiator, a bisacylphosphine oxide compound of the formula

where R$^1$ is alkyl of 1 to 6 carbon atoms, cycloalkyl where the ring is of 5 or 6 carbon atoms, aryl which is unsubstituted or substituted by halogen, alkyl or alkoxy, or an S-containing or N-containing five-membered or six-membered heterocyclic radical, and R$^2$ and R$^3$ are identical or different acyl radicals whose carbonyl group is bonded to a tertiary alkyl radical of 4 to 18 carbon atoms, a tertiary cycloalkyl radical where the ring is of 5 or 6 carbon atoms, aryl or a 5-membered or 6-membered heterocyclic radical, and the aryl or 5-membered or 6-membered heterocyclic radicals contain substituents A and B bonded at least in the two positions ortho to the carbonyl group, and A and B may be identical or different and are each alkyl, alkoxy, alkoxyalkyl, alkylthio, cycloalkyl, aryl or halogen.

2. Photopolymerizable recording material as defined in claim 1, which contains a bisacylphosphine oxide compound of the stated formula where R$^1$ is alkoxy of 1 to 4 carbon atoms or aryl of 6 to 12 carbon atoms.

3. A photopolymerizable recording material as defined in claim 1, which contains a bisacylphosphine oxide compound of the stated formula, where R$^2$ and R$^3$ are each acyl whose carbonyl group is bonded to a tertiary alkyl radical of 4 to 18 carbon atoms or tertiary cycloalkyl radical where the ring is of 5 or 6 carbon atoms.

4. A photopolymerizable recording material as defined in claim 2, which contains a bisacylphosphine oxide compound of the stated formula, where R$^2$ and R$^3$ are each acyl whose carbonyl group is bonded to a tertiary alkyl radical of 4 to 18 carbon atoms or tertiary cycloalkyl radical where the ring is of 5 or 6 carbon atoms.

5. A photopolymerizable recording material as defined in claim 1, wherein R$^2$ and R$^3$ are identical and are each a benzoyl radical which is substituted by groups A and B at least in the 2,6-position.

6. A photopolymerizable recording material as defined in claim 2, wherein R$^2$ and R$^3$ are identical and are each a benzoyl radical which is substituted by groups A and B at least in the 2,6-position.

7. A photopolymerizable recording material as defined in claim 1, which contains a tertiary amine.

8. A photopolymerizable recording material as defined in claim 2, which contains a tertiary amine.

9. A photopolymerizable recording material as defined in claim 1, which contains, as the organic polymeric binder, an acrylate rubber having carboxyl side groups or a polymer having repeating vinyl alcohol groups in the main chain of the molecule.

10. A photopolymerizable recording material as defined in claim 2, which contains, as the organic polymeric binder, an acrylate rubber having carboxyl side groups or a polymer having repeating vinyl alcohol groups in the main chain of the molecule.

11. A process for the production of relief plates which comprises: imagewise exposing a photopolymerizable layer which is applied to a base, which layer consists essentially of the photopolymerizable recording material set forth in claim 1 and thereafter washing out the unexposed parts of the layer of the photopolymerizable recording material with water or an aqueous alkaline solution.

12. A process for the production of relief plates which comprises: imagewise exposing a photopolymerizable layer which is applied to a base, which layer consists essentially of the photopolymerizable recording material set forth in claim 2 and thereafter washing out the unexposed parts of the layer of the photopolymerizable recording material with water or an aqueous alkaline solution.

13. A process for the production of relief plates which comprises: imagewise exposing a photopolymerizable layer which is applied to a base, which layer consists essentially of the photopolymerizable recording material set forth in claim 7 and thereafter washing out the unexposed parts of the layer of the photopolymerizable recording material with water or an aqueous alkaline solution.

14. A process for the production of relief plates which comprises: imagewise exposing a photopolymerizable layer which is applied to a base, which layer consists essentially of the photopolymerizable recording material set forth in claim 9 and thereafter washing out the unexposed parts of the layer of the photopolymerizable recording material with water or an aqueous alkaline solution.

* * * * *